US010903166B2

(12) United States Patent
Ganesan et al.

(10) Patent No.: US 10,903,166 B2
(45) Date of Patent: Jan. 26, 2021

(54) INTEGRATED CIRCUIT PACKAGES

(71) Applicants: Sanka Ganesan, Chandler, AZ (US); Thorsten Meyer, Regensburg (DE); Gerald Ofner, Regensburg (DE); Intel IP Corporation, Santa Clara, CA (US)

(72) Inventors: Sanka Ganesan, Chandler, AZ (US); Thorsten Meyer, Regensburg (DE); Gerald Ofner, Regensburg (DE)

(73) Assignee: Intel IP Corporation, Santa Clara, CA (US)

(*) Notice: Subject to any disclaimer, the term of this patent is extended or adjusted under 35 U.S.C. 154(b) by 90 days.

(21) Appl. No.: 16/060,918

(22) PCT Filed: Jan. 28, 2016

(86) PCT No.: PCT/US2016/015260
§ 371 (c)(1),
(2) Date: Jun. 8, 2018

(87) PCT Pub. No.: WO2017/131683
PCT Pub. Date: Aug. 3, 2017

(65) Prior Publication Data
US 2019/0363052 A1 Nov. 28, 2019

(51) Int. Cl.
*H01L 29/40* (2006.01)
*H01L 23/532* (2006.01)
(Continued)

(52) U.S. Cl.
CPC ........ *H01L 23/53228* (2013.01); *H01L 22/12* (2013.01); *H01L 23/5384* (2013.01);
(Continued)

(58) Field of Classification Search
CPC ....... H01L 2924/00014; H01L 2924/00; H01L 2224/131; H01L 2924/181;
(Continued)

(56) References Cited

U.S. PATENT DOCUMENTS

2006/0244142 A1* 11/2006 Waidhas ............. H01L 23/3128
257/738
2007/0293636 A1* 12/2007 Kimura ................. C08G 18/12
525/453
(Continued)

FOREIGN PATENT DOCUMENTS

TW 201243970 A 11/2012
WO 2017131683 A1 8/2017

OTHER PUBLICATIONS

"Embedded Wafer Level Ball Grid Array", Wikipedia, retrieved from the Internet on Jan. 3, 2016, https://en.wikipedia.org/wiki/Embedded_Wafer_level_Ball_Grid_Array, 4 pages.
(Continued)

*Primary Examiner* — Robert G Bachner
(74) *Attorney, Agent, or Firm* — Patent Capital Group

(57) ABSTRACT

Disclosed herein are integrated circuit (IC) packages, and related structures and techniques. In some embodiments, an IC package may include: a die; a redistribution structure, wherein the die is coupled to the redistribution structure via first-level interconnects and solder; a solder resist; and second-level interconnects coupled to the redistribution structure through openings in the solder resist.

25 Claims, 8 Drawing Sheets

(51) Int. Cl.
*H01L 21/66* (2006.01)
*H01L 23/538* (2006.01)
*H01L 23/00* (2006.01)
*H01L 25/065* (2006.01)

(52) U.S. Cl.
CPC ...... *H01L 23/5385* (2013.01); *H01L 23/5386* (2013.01); *H01L 24/17* (2013.01); *H01L 24/33* (2013.01); *H01L 24/95* (2013.01); *H01L 25/0655* (2013.01); *H01L 2225/06513* (2013.01)

(58) Field of Classification Search
CPC ..... H01L 2924/00012; H01L 2924/014; H01L 2924/15311; H01L 2224/73265; H01L 2224/32225; H01L 2224/48227; H01L 2224/12105; H01L 2224/81; H05K 1/181; H05K 2201/10325; H05K 1/147; H05K 2201/10159; H05K 2201/10515; H05K 2201/1053; H05K 2201/2009; H05K 7/023; H05K 13/00; H05K 1/00; H05K 1/0233; H05K 1/0292; H05K 1/03; H05K 1/11; H05K 1/142; H05K 1/144; H05K 1/162; H05K 1/165; H05K 1/18; H05K 1/185; H05K 2201/042; H05K 2201/056; H05K 2201/10189; H05K 2201/10318; H05K 2201/10424; H05K 2201/10636; H05K 2201/10674; H05K 2201/10681; H05K 2203/06; H05K 2203/1469; H05K 2203/171; H05K 2203/173; H05K 2203/175; H05K 3/34; H05K 3/3436; H05K 3/36; H05K 3/361; H05K 3/363; H05K 3/4644; H05K 7/02; H05K 7/10
See application file for complete search history.

(56) References Cited

U.S. PATENT DOCUMENTS

| | | | |
|---|---|---|---|
| 2009/0170242 A1 | 7/2009 | Lin et al. | |
| 2010/0139963 A1* | 6/2010 | Ishido | H05K 1/111 174/260 |
| 2013/0062761 A1 | 3/2013 | Lin et al. | |
| 2014/0252594 A1* | 9/2014 | Meng | H01L 21/6835 257/737 |
| 2015/0179481 A1* | 6/2015 | Lin | H01L 21/568 257/790 |
| 2015/0287691 A1 | 10/2015 | Chou et al. | |
| 2015/0340403 A1 | 11/2015 | Ho et al. | |
| 2015/0348931 A1 | 12/2015 | Lee et al. | |
| 2015/0380350 A1* | 12/2015 | Yu | H01L 21/76816 257/774 |

OTHER PUBLICATIONS

International Search Report and Written Opinion issued in PCT Application No. PCT/US2016/015260 dated Oct. 25, 2016; 12 pages.
Taiwan First OA and Search Report in Taiwan Patent Office Application No. 105139925 dated Apr. 17, 2020, 10 pages (with summary of relevance).
German Office Action in Germany Patent Office Application No. 112016006322.9 dated Oct. 12, 2020, 8 pages.
Taiwan Second OA and Search Report in Taiwan Patent Office Application No. 105139925 dated Oct. 14, 2020, 9 pages.

* cited by examiner

INTEGRATED CIRCUIT PACKAGES

CROSS-REFERENCE TO RELATED APPLICATION

This application is a national stage application under 35 U.S.C. § 371 of PCT International Application Serial No. PCT/US2016/015260, filed on Jan. 28, 2016 and entitled "Integrated Circuit Packages," which is hereby incorporated by reference in its entirety.

TECHNICAL FIELD

The present disclosure relates generally to integrated circuits (ICs) structures, and more particularly, to IC packages.

BACKGROUND

Conventional flip chip packages are formed by attaching a die to a substrate. The substrate is typically a printed circuit board (PCB).

BRIEF DESCRIPTION OF THE DRAWINGS

Embodiments will be readily understood by the following detailed description in conjunction with the accompanying drawings. Embodiments are illustrated by way of example, and not by way of limitation, in the figures of the accompanying drawings.

DETAILED DESCRIPTION

Figure 1:
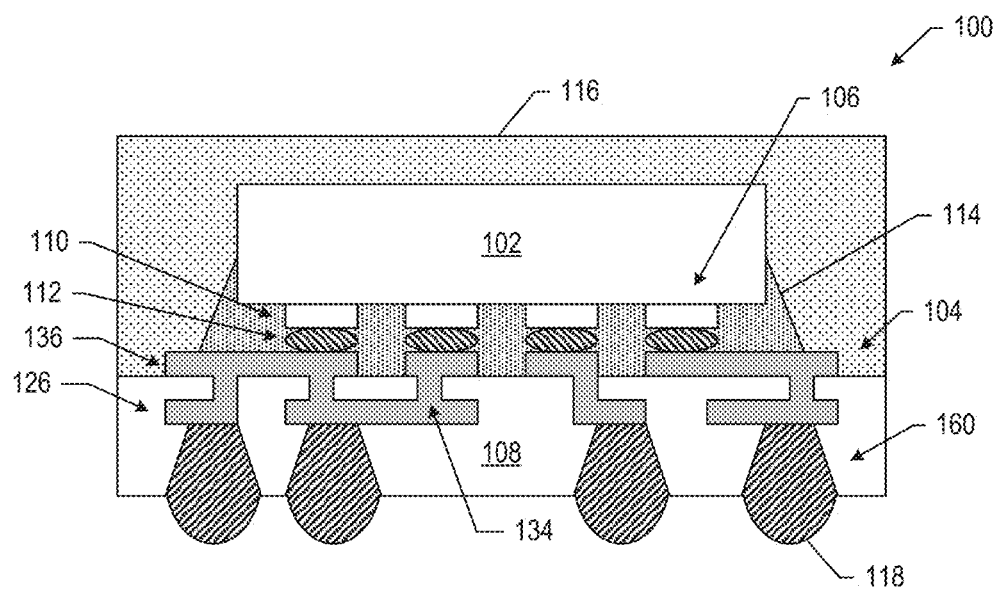
FIG. 1 is a side cross-sectional view of an integrated circuit (IC) package, in accordance with various embodiments.

Disclosed herein are integrated circuit (IC) packages, and related structures and techniques. In some embodiments, an IC package may include: a die; a redistribution structure, wherein the die is coupled to the redistribution structure via first-level interconnects and solder; a solder resist; and second-level interconnects coupled to the redistribution structure through openings in the solder resist. Such an IC package may be coupled, via the second-level interconnects, to a substrate (e.g., a printed circuit board (PCB) or another IC package) in a computing device, for example.

As noted above, conventional flip chip packages have required a substrate to which the die is attached during packaging. This substrate is typically manufactured using printed circuit board (PCB) technologies, which may be able to accommodate only rough design rules (e.g., minimum feature sizes). Such PCB-based substrates may be inadequate for the tighter design rules that may be desired as electronic devices shrink. Further, the cost of a PCB-based substrate may represent a substantial fraction of the total cost of a package (e.g., larger than the fraction attributable to underfill or molding, providing flip chip bumps, or other assembly operations), even in package designs intended to be "low cost." This may mean that the cost of a flip chip device with such a substrate is strongly dependent on the substrate size and complexity (e.g., pitch, number of layers, design rules, etc.).

Disclosed herein are IC packages that do not require a PCB-based substrate, and can achieve tight pitches to enable next-generation electronic devices. For example, various ones of the embodiments disclosed herein may achieve pitches of 50 µm for first-level interconnects. In some of the embodiments disclosed herein, a redistribution structure is formed, then a die (e.g., a flip chip die) is attached to that redistribution structure (e.g., using solder and any desired first-level interconnect, such as a bump or a copper pillar). Over/undermolding (or underfill followed by overmolding) may be performed, as desired. This may be contrasted with some conventional packaging techniques, in which a redistribution structure is built up using a die as a substrate, and may have a number of advantages, as discussed herein.

Various ones of the embodiments disclosed herein may be made at lower cost than conventional packages (e.g., due to the lack of substrate), may adhere to finer design rules than conventional packages (e.g., the design rules of thin film technology instead of the design rules of standard substrate technology), may involve fewer materials than conventional packages, may enable higher yields when packages are manufactured in large volume (due to, e.g., a reduced loss of operational dies, as discussed herein), and/or may improve the speed of new product development by reducing a manufacturer's dependence on substrate vendors. For example, the PCB-less flip chip packages disclosed herein may provide a number of these advantages relative to conventional flip chip packages.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

FIG. 1 is a side cross-sectional view of an integrated circuit (IC) package 100, in accordance with various embodiments. The IC package 100 may include a die 102 coupled to a redistribution structure 104 via first-level interconnects 106 and solder 112. Second-level interconnects 118 may be coupled to the redistribution structure 104 through openings 160 in the solder resist 108.

The die 102 may include functional circuitry formed on and/or in a semiconductor material, as known in the art. In some embodiments, the die 102 may include one or more processing devices, one or more memory devices, one or more passive components, and/or any other suitable circuitry.

The first-level interconnects 106 may provide electrical routing pathways between the die 102 and the redistribution structure 104. In the embodiment illustrated in FIG. 1, the first-level interconnects 106 may include copper pillars 110. In other embodiments, the first-level interconnects 106 may include flip chip bumps or any other suitable interconnects known in the art.

The redistribution structure 104 may be formed of a conductive material (e.g., a metal, such as copper) and may provide electrical routing pathways between the first-level interconnects 106 and the second-level interconnects 118. The redistribution structure 104 may be formed of one or more redistribution layers. For example, in the embodiment illustrated in FIG. 1, the redistribution structure 104 may include a first redistribution layer 126, a second redistribution layer 136, and multiple vias 134 electrically coupling the first redistribution layer 126 to the second redistribution layer 136. In other embodiments, the redistribution structure 104 may include fewer redistribution layers (e.g., as discussed below with reference to FIG. 14) or more redistribution layers, as desired.

The solder resist 108 may provide electrical isolation around and within the redistribution structure 104. For example, as illustrated in FIG. 1, in some embodiments in which the redistribution structure 104 includes multiple redistribution layers, the solder resist 108 may extend between at least two of the multiple redistribution layers. As noted above, the solder resist 108 may include openings 160 through which second-level interconnects 118 extend. The solder resist 108 may be formed of an insulating polymer material (e.g., a dielectric), and may take any of a number of forms. For example, in some embodiments, the solder resist 108 may be a film, such as Ajinomoto build-up film. In some embodiments, the solder resist 108 may be a laminate or a mold sheet. In some embodiments, the solder resist 108 may be photoimageable, and/or capable of being structured by etching. If the solder resist 108 is not photoimageable (e.g., formed from a non-photoimageable mold sheet or laminate, such as a prepreg material), a laser-assisted process may be used to create the openings 160. Various embodiments of the solder resist 108 and the openings 160 are also discussed below with reference to FIGS. 2-13.

The second-level interconnects 118 may provide electrical pathways between the redistribution structure 104 and a substrate (not shown in FIG. 1, but discussed below with reference to FIG. 17) to which the IC package 100 may be coupled. In the embodiment illustrated in FIG. 1, the second-level interconnects 118 may include solder balls. In some embodiments, the solder balls included in the second-level interconnects 118 may be ball grid array (BGA) balls to provide BGA interconnects, for example. In other embodiments, the second-level interconnects 118 may include solder paste contacts (e.g., as discussed below with reference to FIG. 16) to provide land grid array (LGA) interconnects.

An underfill material 114 may be disposed between the die 102 and the redistribution structure 104. In some embodiments, the underfill material 114 may be selected to have a low enough coefficient of thermal expansion (CTE) to avoid failure due to warpage (e.g., during manufacturing). In particular, after applying and carrying the underfill material 114, the IC package 100 (and any other IC packages coupled to the IC package 100 in a panel or a wafer, as discussed below with reference to FIGS. 2-13) may warp, and the amount of this warpage may be controlled by controlling the CTE of the underfill material 114. Lower values of the CTE may be associated with a lesser likelihood of warpage failure. In some embodiments, the CTE of the underfill material 114 may be between 8 and 18 ppm per degree Celsius. In some particular embodiments, the CTE of the underfill material 114 may be between 10 and 14 ppm per degree Celsius.

The underfill material 114 may include filler particles, and the CTE of the underfill material 114 may be a function of, among other variables, the filler content of the underfill material 114. In particular, a higher filler content may be associated with a lower CTE, and vice versa. In some embodiments, the filler content of the underfill material 114 may be between 65 and 90%. In some particular embodiments, the CTE of the underfill material 114 may be between 70 and 90%, between 75 and 90%, or between 85 and 90%.

The filler content of the underfill material 114 may be associated with the maximum size of the filler particles (referred to as the "filler cut"). In particular, a higher filler cut may be associated with a lower filler content (due to lower packing efficiency), and vice versa. In some embodiments, the filler cut of the underfill material 114 may be between 5 and 75 μm. In some particular embodiments, the filler cut of the underfill material 114 may be between 5 and 60 μm, between 15 and 60 μm, or between 25 and 60 μm. In some embodiments, the filler cut of the underfill material 114 may be greater than or equal to 15 μm.

A mold material 116 may be disposed on the die 102 such that the die 102 is disposed between at least a part of the mold material 116 and the underfill material 114, as shown in FIG. 1. For example, the mold material 116 may provide an overmold for the die 102, as shown. The mold material 116 may take any of the forms discussed above with reference to the underfill material 114 (e.g., with reference to CTE, filler content, and filler cut). Any suitable material may be used for the mold material 116. In some applications, the mold material 116 may have a glass transition temperature in the range of 160-175 C. In some applications, the mold material 116 may have a CTE in the range of 15-25

PPM. In some applications, the mold material 116 may have a modulus of 3 GPa or greater. In some embodiments, the mold material 116 may not be included, and the die 102 may be exposed in the IC package 100.

In some embodiments, the underfill material 114 and the mold material 116 may be a same material. In some such embodiments, the underfill material 114 and the mold material 116 may be provided to the IC package 100 in a single process step. For example, the underfill material 114 may be provided as undermold during a single molding operation.

The IC package 100 of FIG. 1 may be manufactured in any suitable manner. For example, FIGS. 2-13 illustrate a particular manufacturing process by illustrating example assemblies in the manufacture of the IC package 100 of FIG. 1, in accordance with various embodiments. In particular, the process depicted in FIGS. 2-13 illustrates the manufacture of two IC packages 100 simultaneously in a common panel or wafer. The depiction of two IC packages 100 is for ease of illustration, and any suitable number of IC packages 100 may be simultaneously manufactured in accordance with the techniques disclosed herein. The assemblies depicted in FIGS. 2-13 are simply illustrative, and variations are discussed below and will be understood by those of skill in the art.

Figure 2:
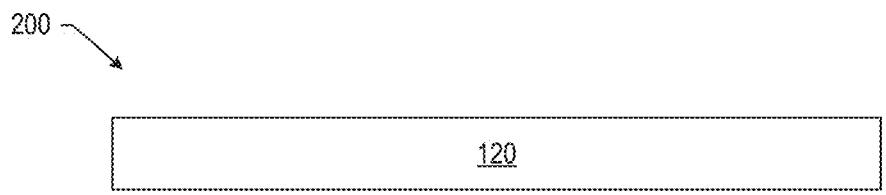
FIGS. 2-13 illustrate example assemblies in the manufacture of the IC package of FIG. 1, in accordance with various embodiments.

FIG. 2 depicts an assembly 200 including a carrier 120. The carrier 120 may be formed of any suitable material that can act as a physical support for the manufacturing operations illustrated in FIGS. 3-9. Thermally stable materials, such as stainless steel, glass, or silicon, may be desirable as the carrier 120 may undergo multiple thermal excursions in subsequent processing operations. In some applications, the carrier 120 may be formed of any material used as a carrier in embedded wafer level ball grid array (eWLB) packaging techniques.

Figure 3:
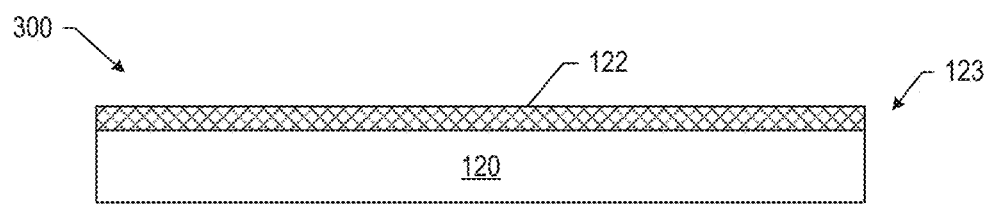

FIG. 3 depicts an assembly 300 subsequent to providing a releasable layer 122 on the carrier 120 of the assembly 200. As discussed further below with reference to FIG. 10, the releasable layer 122 may serve to enable the removal of the carrier 120 from further structures built on top of the releasable layer 122, and thus the releasable layer 122 may be formed of any suitable material to achieve that objective. In some embodiments, the releasable layer 122 may include a foil. In some embodiments, the releasable layer 122 may include a glue. The releasable layer 122 may be provided on the carrier 120 using any suitable technique, such as printing, lamination, spray coating, or spin coating, for example. The releasable layer 122 and the carrier 120 may together form a sacrificial support 123.

Figure 4:
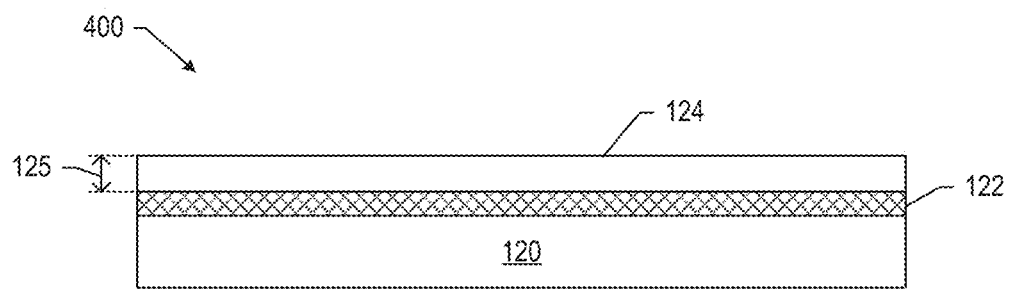

FIG. 4 depicts an assembly 400 subsequent to providing a solder resist layer 124 on the releasable layer 122 of the assembly 300. In particular, the releasable layer 122 may be disposed between the solder resist layer 124 and the carrier 120 in the assembly 400. The solder resist layer 124 may be formed of any suitable material, such as any of the materials discussed above with reference to the solder resist 108 of FIG. 1. For example, the solder resist layer 124 may include a film, a laminate, or a mold sheet. In some embodiments, the solder resist layer 124 may secured to the releasable layer 122, and may be provided to the carrier 120 together (instead of into separate operations). The solder resist layer 124 may be provided using any suitable manufacturing techniques, such as lamination or printing. In the embodiment illustrated in FIG. 4, the solder resist layer 124 is a solid layer and does not include any openings. In other some embodiments, the solder resist layer 124 may include the openings 160 (illustrated in FIG. 1) when the solder resist layer 124 is secured to the carrier 120 (after or simultaneously with the releasable layer 122). For example, the solder resist layer 124 may be printed on the releasable layer 122 with a structure that includes the openings 160. In some embodiments, the solder resist layer 124 may be structured (e.g., by photolithography or other techniques) to include the openings 160 shortly after the solder resist layer 124 is secured to the carrier 120 (after or simultaneously with the releasable layer 122), but before a redistribution structure is formed (e.g., as discussed below with reference to FIG. 5). The solder resist layer 124 may have a thickness 125. In some embodiments, the thickness 125 may be in the range of 15-25 μm.

Figure 5:
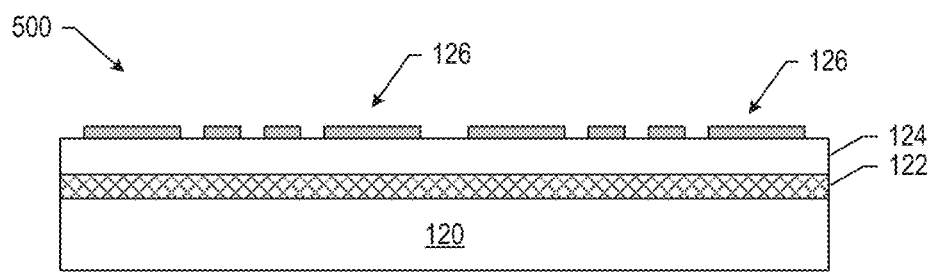

FIG. 5 illustrates an assembly 500 subsequent to forming a first redistribution layer 126 on the solder resist layer 124 of the assembly 400. The first redistribution layer 126 may be formed using any suitable manufacturing technique, such as sputter and electroplating, electroless plating and electroplating, or by electroless plating alone. Although FIGS. 4 and 5 depict the first redistribution layer 126 being formed on the solder resist layer 124 after the solder resist layer 124 has been secured to the carrier 120, in some embodiments, the solder resist layer 124 may already be carrying the first redistribution layer 126 when the solder resist layer 124 is secured to the carrier 120 (together with or separate from the releasable layer 122). In some embodiments, the solder resist layer 124 may be carrying a conductive material (e.g., a metal) when the solder resist layer 124 secured to the carrier 120 (together with our separate from the releasable layer 122), and the first redistribution layer 126 may be formed from a conductive material using a subtractive process after the solder resist layer 124 secured to the carrier 120.

Figure 6:
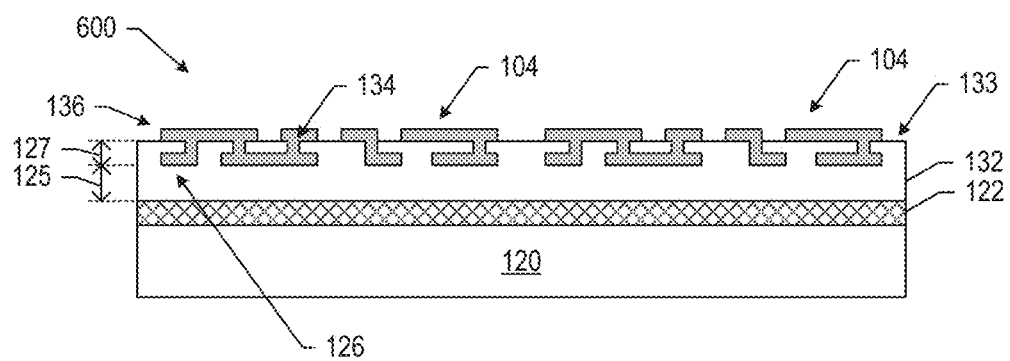

FIG. 6 illustrates an assembly 600 subsequent to forming vias 134 and a second redistribution layer 136 on the assembly 500. The first redistribution layer 126, the vias 134, and the second redistribution layer 136 may together form the redistribution structure 104, in some embodiments. As part of the formation of the full redistribution structure 104, additional solder resist material 133 may be provided on top of the solder resist layer 124 to form the solder resist material 132. For example, as known in the art, the additional solder resist material 133 may be provided on top of the first redistribution layer 126, then patterned with openings for the locations of the vias 134, then provided with conductive material for the vias 134, and then the second redistribution layer 136 may be provided so that the vias 134 electrically couple the second redistribution layer 136 and the first redistribution layer 126. Any suitable thin film fabrication technology may be used to form the redistribution structure 104, in various embodiments.

In the assembly 600, the additional solder resist material 133 may have a thickness 127. The thickness 127 may be different from the thickness 125 of the solder resist layer 124. For example, in some embodiments, the thickness 127 may be less than the thickness 125 of the solder resist layer 124, and may be selected to provide design flexibility in selecting the size of a second-level interconnect (e.g., a BGA ball, for example). As discussed above with reference to FIG. 1, in some embodiments, the redistribution structure 104 may include a single redistribution layer (e.g., the first redistribution layer 126), or more than two redistribution layers. In embodiments of the IC package 100 that include multiple redistribution layers, the thickness of the second redistribution layer 136 (and any subsequent redistribution layer) may be different from the thickness of the first redistribution layer.

Figure 7:
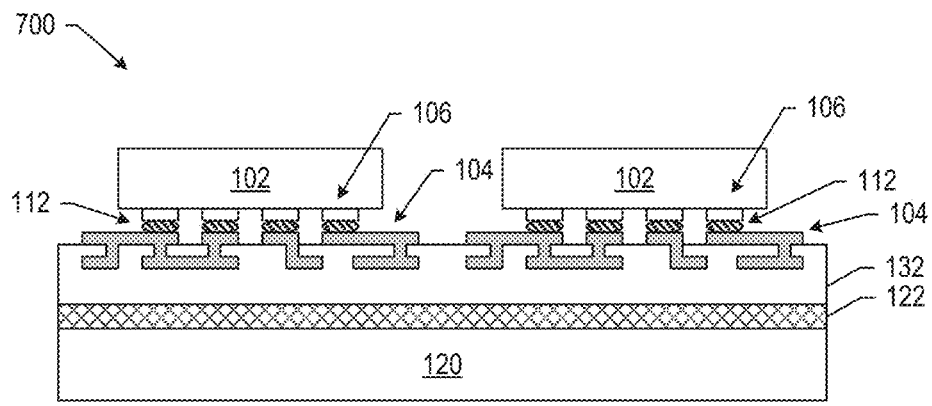

FIG. 7 illustrates an assembly 700 subsequent to attaching a die 102 to the redistribution structure 104 of the assembly 600 via first-level interconnects 106 and solder 112. The first-level interconnects 106 of FIG. 7 may take the form of any of the first-level interconnects 106 discussed above with reference to FIG. 1. In some embodiments, the die 102 may be flip chip-bonded to the redistribution structure 104. In some such embodiments, a mass reflow operation may be performed to achieve electrical interconnection between the die 102 and the redistribution structure 104. Although no underfill is depicted in FIG. 7, in some embodiments, a no-flow underfill process may be performed prior to attaching the die 102 to the redistribution structure 104. In such a process, an underfill material may be provided on the redistribution structure 104, and may flow to fill the appropriate area between the die 102 and the redistribution structure 104 when the die 102 is electrically connected to the redistribution structure 104.

Figure 8:
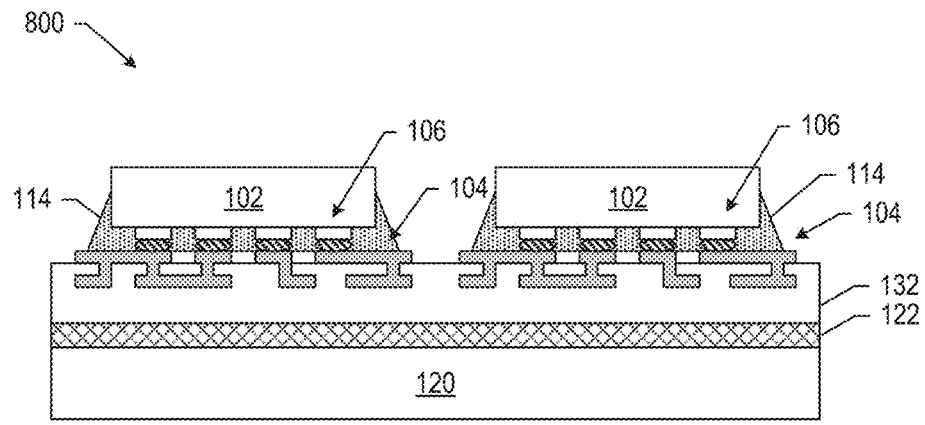

FIG. 8 illustrates an assembly 800 subsequent to providing an underfill material 114 between the die 102 and the redistribution structure 104 of the assembly 700. The underfill material 114 of FIG. 8 may take the form of any of the underfill material 114 discussed above with reference to FIG. 1. In some embodiments, the provision of the underfill material 114 may be done by capillary underfill, followed by cure. Although FIGS. 7 and 8 illustrate separate attachment of the die 102 and provision of the underfill material 114 in other embodiments, a thermal-compression-bonding operation may be used to secure the die 102 to the redistribution structure 104. In some such embodiments, an underfill material or other non-conductive paste may be applied to the redistribution structure 104 prior to attachment of the die 102, and the electrical interconnection between the die 102 and the redistribution structure 104 may be performed, along with the underfill cure, in one step.

Figure 9:
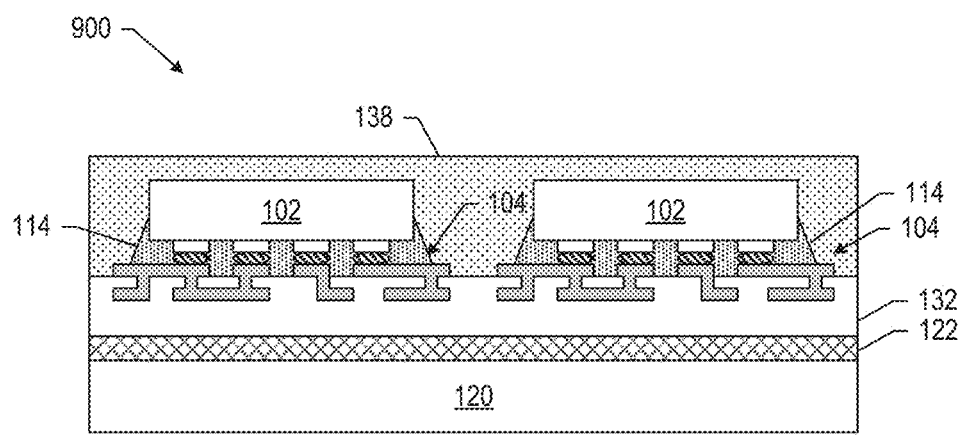

FIG. 9 illustrates an assembly 900 subsequent to providing a mold material 138 over and around the die 102 of the assembly 800. The mold material 138 may take the form of any of the embodiments of the mold material 116 discussed above with reference to FIG. 1. This overmolding may be performed by compression molding, sheet molding, delamination, or any other suitable operation. In some embodiments, this overmolding may not be performed. Other FIGS. 8 and 9 illustrate the separate provision of underfill and overmold materials; in some embodiments, the underfill material 114 and the mold material 138 may be provided in a single process step (e.g., simultaneous over- and undermolding). When simultaneous over- and undermolding is performed, a smaller filler cut may be desirable (e.g., 10-20 μm in some applications) so that the filler can fill the gap between the die 102 and the solder resist material 132.

Figure 10:
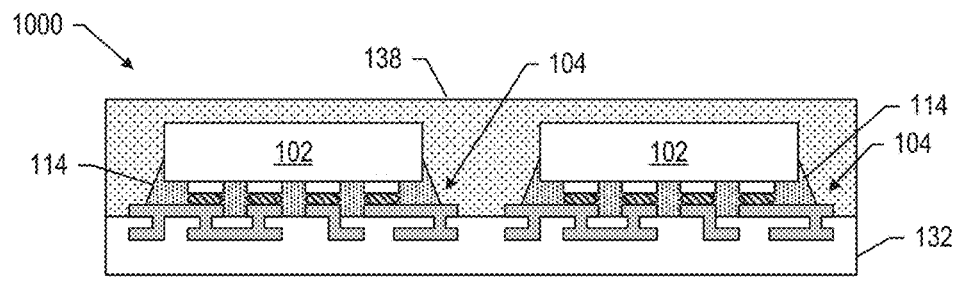

FIG. 10 illustrates an assembly 1000 subsequent to removing the sacrificial support 123 from the assembly 900 to expose the solder resist material 132. The technique used to remove the sacrificial support 123 may depend on the type of material used in the releasable layer 122, and may include heat, chemical energy, light, mechanical force, or any combination of appropriate techniques.

Figure 11:
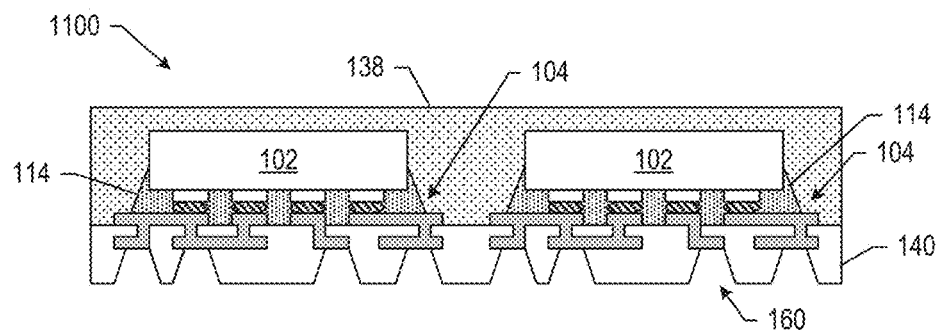

FIG. 11 illustrates an assembly 1100 subsequent to structuring the solder resist material 132 of the assembly 1000 to form a structured solder resist material 140 having openings 160 to the redistribution structure 104. The openings 160 may make the redistribution structure 104 accessible for second-level interconnects 118, as discussed below. In some embodiments, the openings 160 may be tapered so as to be narrower towards the redistribution structure 104, as illustrated in FIG. 11. The structured solder resist material 140 may be formed using any suitable techniques (depending, e.g., on the particular material properties of the structured solder resist material 140), such as laser structuring, photolithography, etching, or any other suitable technique. In some embodiments, the redistribution structure 104 may serve as a stopping layer during the formation of the openings 160 (e.g., by etching).

Figure 12:
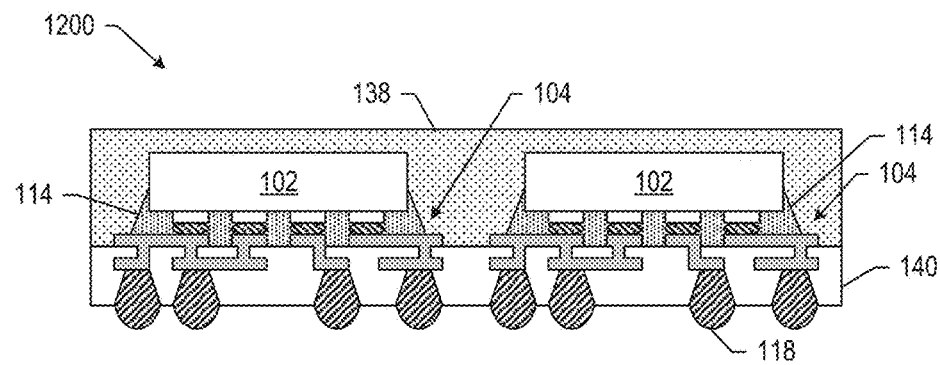

FIG. 12 illustrates an assembly 1200 subsequent to providing second-level interconnects 118 to the openings 160 of the assembly 1100. The second-level interconnects 118 may take any of the forms discussed above with reference to FIG. 1, such as BGA balls, semi-balls, or solder paste contacts (for LGA interconnection); solder balls are illustrated in FIG. 12.

Figure 13:
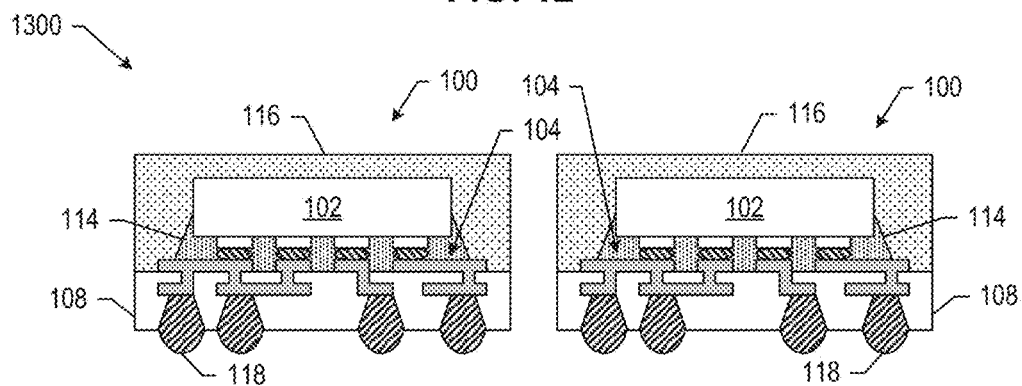

FIG. 13 illustrates an assembly 1300 subsequent to separating the structures of the assembly 1200 into two separate IC packages 100. This may be performed by laser cutting, or any other suitable singulation technique.

As noted above, although the manufacture of two IC packages 100 is illustrated with reference to FIGS. 2-13, the techniques discussed above may be used to simultaneously manufacture any suitable number of IC packages 100. Additionally, although the manufacture of an IC package 100 having a particular structure is illustrated in FIGS. 2-13, the techniques discussed above with reference to FIGS. 2-13 may be utilized to manufacture any appropriate IC package 100, a number of which are discussed below with reference to FIGS. 14-16.

Figure 14:
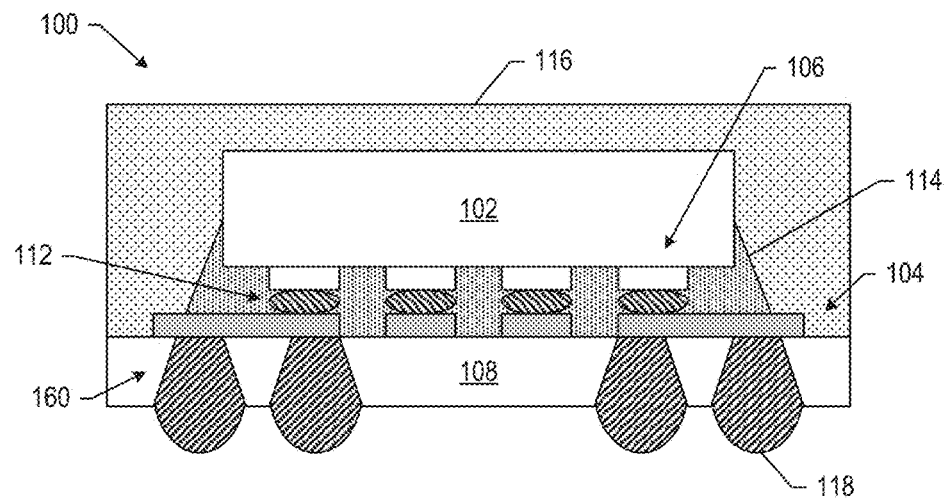
FIG. 14 is a side cross-sectional view of an IC package having a single-layer redistribution structure, in accordance with various embodiments.

As noted above, in some embodiments, a redistribution structure 104 may include only a single redistribution layer. For example, FIG. 14 is a side cross-sectional view of an IC package 100 having a single-layer redistribution structure 104, in accordance with various embodiments. The redistribution structure 104 of FIG. 14 may be coupled to a die 102 via solder 112 and first-level interconnects 106. Second-level interconnects 118 may be coupled to the redistribution structure 104 through openings 160 in the solder resist 108. The die 102, first-level interconnects 106, second-level interconnects 118, openings 160, and solder resist 108 may take any of the forms disclosed herein.

Figure 15:
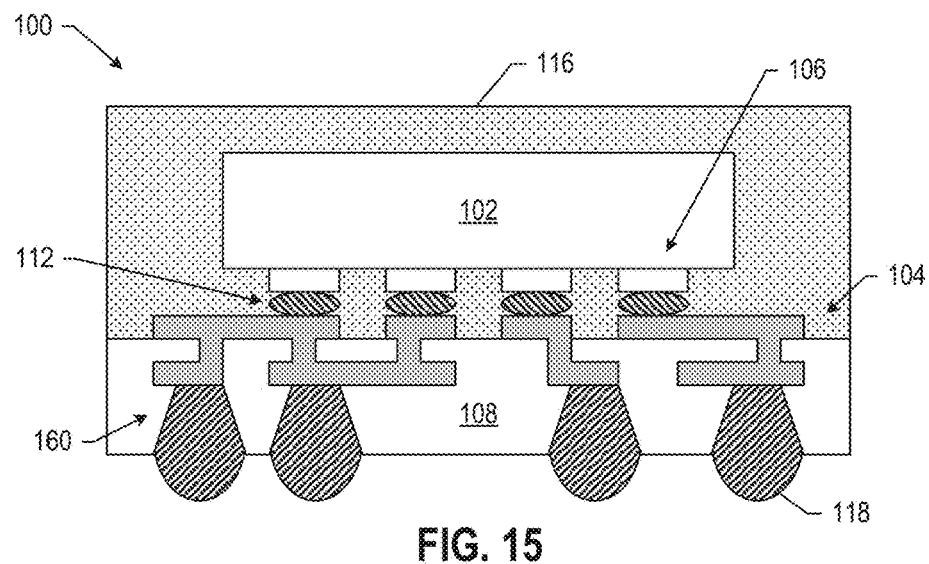
FIG. 15 is a side cross-sectional view of an IC package that is over- and undermolded in a single process step, in accordance with various embodiments.

As noted above, in some embodiments, an IC package 100 may be over- and undermolded in a single process step. For example, FIG. 15 is a side cross-sectional view of an IC package 100 that is over- and undermolded in a single process step so that the mold material 116 provides both the overmold and the underfill. The redistribution structure 104 of FIG. 15 may be coupled to a die 102 via solder 112 and first-level interconnects 106. Second-level interconnects 118 may be coupled to the redistribution structure 104 through openings 160 in the solder resist 108. The die 102, first-level interconnects 106, second-level interconnects 118, openings 160, and solder resist 108 may take any of the forms disclosed herein.

Figure 16:
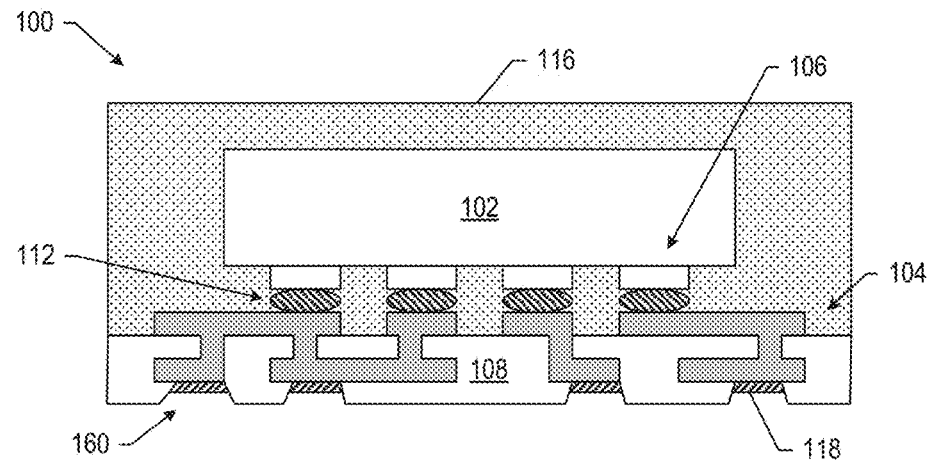
FIG. 16 is a side cross-sectional view of an IC package having solder paste contacts as the second-level interconnects, in accordance with various embodiments.

As noted above, in some embodiments, an IC package 100 may include solder paste contacts as the second-level interconnects 118. For example, FIG. 16 is a side cross-sectional view of an IC package 100 having solder paste contacts as the second-level interconnects 118, in accordance with various embodiments. The solder paste contacts may be portions of the redistribution structure 104 that are wedded with solder (e.g., by applying solder paste then performing a reflow). As discussed above, solder paste contacts may be suitable for use in an LGA interconnect system in which the substrate to which the IC package 100 is to be coupled includes pins to contact the solder paste contacts. The redistribution structure 104 of FIG. 16 may be coupled to a die 102 via solder 112 and first-level interconnects 106. Second-level interconnects 118 may be coupled to the redistribution structure 104 through openings 160 in the solder resist 108. The die 102, first-level interconnects 106, openings 160, and solder resist 108 may take any of the forms disclosed herein.

Figure 17:
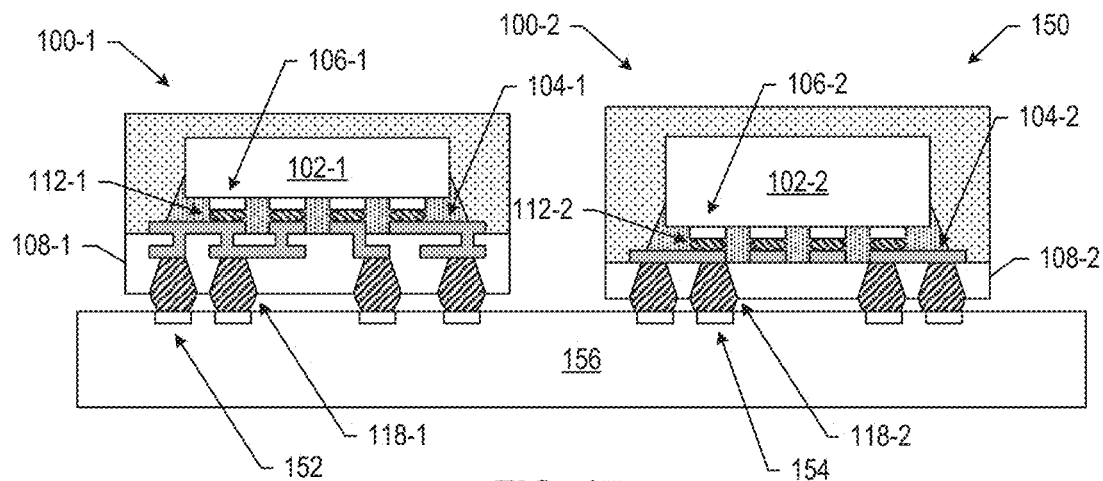
FIG. 17 is a side cross-sectional view of a package assembly including multiple IC packages coupled to a substrate, in accordance with various embodiments.

The IC packages 100 disclosed herein may be coupled to any suitable substrate. For example, FIG. 17 is a side cross-sectional view of a package assembly 150 including multiple IC packages 100-1 and 100-2 coupled to a substrate 156, in accordance with various embodiments. The IC package 100-1 may be electrically coupled to the substrate 156 via conductive contacts 152, and the IC package 100-2 may be electively coupled to the substrate 156 via conductive contacts 154. In embodiments in which the second-level interconnects 118-1 of the IC package 100-1 are solder paste contacts, the conductive contacts 152 of the substrate 156 may include pins as part of an LGA interconnect. The redistribution structures 104-1 and 104-2 of FIG. 17 may each be coupled to a respective die 102-1 and 102-2 via respective solder 112-1 and 112-2 and respective first-level interconnects 106-1 and 106-2. Second-level interconnects 118-1 and 118-2 may be coupled to respective redistribution structures 104-1 and 104-2 through respective openings 160-1 and 160-2 in respective solder resist 108-1 and 108-2. The die 102, first-level interconnects 106, second-level interconnects 118, openings 160, and solder resist 108 of FIG. 17 may take any of the forms disclosed herein. Other IC packages and/or any other components (e.g., passive components, not shown) may also be coupled to the substrate 156.

The substrate 156 may include electrical routing pathways from the contacts 152 and/or the contacts 154 to any other suitable locations or devices, as known in the art; these pathways are not illustrated for clarity of discussion. In some embodiments, the substrate 156 may be a printed circuit board (PCB). In some embodiments, the substrate 156 may be another IC package, and the package assembly 150 may be a package-on-package structure. In some embodiments, the substrate 156 may be an interposer. In some embodiments, the substrate 156 may be a flexible and/or wearable substrate, such as an item of clothing, bracelet, armband, accessory, or piece of jewelry.

Figure 18:
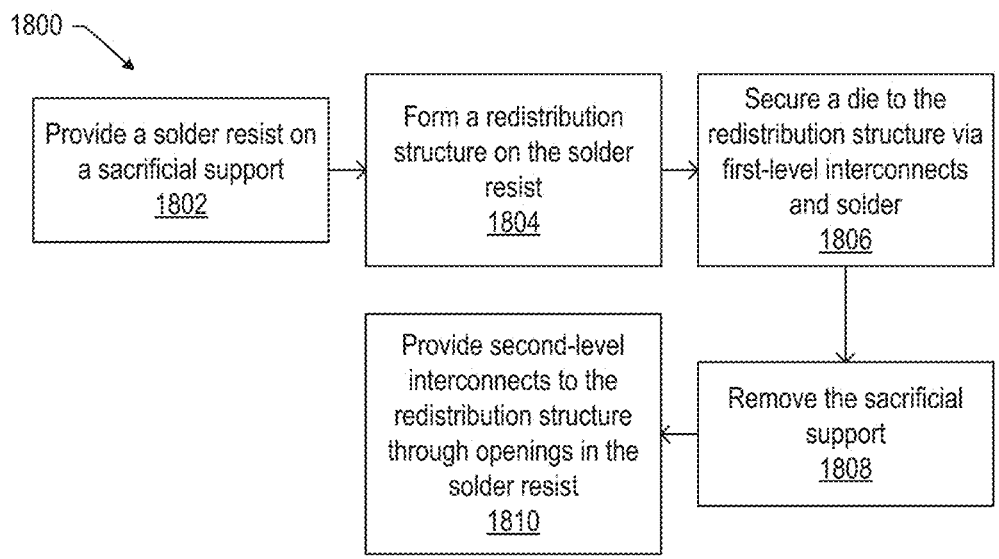
FIG. 18 is a flow diagram of a first method of manufacturing an IC package, in accordance with various embodiments.

FIG. 18 is a flow diagram of a first method 1800 of manufacturing an IC package, in accordance with various embodiments. While the operations of the method 1800 are arranged in a particular order in FIG. 18 and illustrated once each, in various embodiments, one or more of the operations may be repeated or performed in parallel (e.g., when multiple IC packages are manufactured simultaneously). Operations discussed below with reference to the method 1800 may be illustrated with reference to the IC package 100, but this is simply for ease of discussion, and the method 1800 may be used to manufacture any suitable IC package.

At 1802, a solder resist may be provided on a sacrificial support. For example, the solder resist layer 124 may be provided on the sacrificial support 123 (including the releasable layer 122 and the carrier 120), as discussed above with reference to FIG. 4. The solder resist provided at 1802 may take the form of any of the solder resists disclosed herein (e.g., the solder resist 108).

At 1804, a redistribution structure may be formed on the solder resist. For example, the redistribution structure 104 may be formed on the solder resist material 132, as discussed above with reference to FIGS. 5-6. The redistribution structure formed at 1804 may take the form of any of the redistribution structures disclosed herein (e.g., the redistribution structure 104).

At 1806, a die may be secured to the redistribution structure via first-level interconnects and solder. For example, the die 102 may be secured to the redistribution structure 104, the first-level interconnects 106, and solder 112, as discussed above with reference to FIGS. 1, 7, and 14-16. The die, first-level interconnects, and solder of 1806 may take any of the forms disclosed herein (e.g., the die 102, the first-level interconnects 106, and the solder 112, respectively).

At 1808, the sacrificial support may be removed. For example, the sacrificial support 123 may be removed from the solder resist material 132, as discussed above with reference to FIG. 10.

At 1810, second-level interconnects may be provided to the redistribution structure through openings in the solder resist. For example, the second-level interconnects 118 may be provided to the redistribution structure 104 through openings 160 in the structured solder resist material 140, as discussed above with reference to FIG. 12. The second-level interconnects and the openings of 1810 may take any of the forms disclosed herein (e.g., the second-level interconnects 118, and the openings 160, respectively).

Various ones of the manufacturing techniques disclosed herein include securing a die to a redistribution structure after that redistribution structure has been formed. This is in contrast to some conventional manufacturing techniques (e.g., conventional eWLB techniques, conventional fan-out wafer level package (FO-WLP) techniques, and conventional fan-out panel level package (FO-PLP) techniques), in which a redistribution structure may be built on top of a die, layer by layer. In such conventional techniques, if an error occurs during the manufacturing of the redistribution structure such that the redistribution structure does not pass required quality tests, both the failed redistribution structure and the die (coupled to the redistribution structure) are scrapped. Dies are often expensive to manufacture, especially as they become larger and larger, and so the loss of an operational die due to redistribution structure defects represents an undesirable waste. For example, in some embodiments of the IC packages disclosed herein, a die may have an area of 50 square millimeters or greater (e.g., 100-200 square millimeters). By forming the redistribution structure separately from the die, the manufacturing techniques disclosed herein enable the redistribution structure to be tested to make sure that it meets required quality metrics before an expensive die is attached. If the redistribution structure fails a quality test, then it may simply be discarded (e.g., not used as originally intended but redirected to another use, or discarded as waste) without ever having a die attached, and thus the unnecessary waste of dies is reduced.

Figure 19:
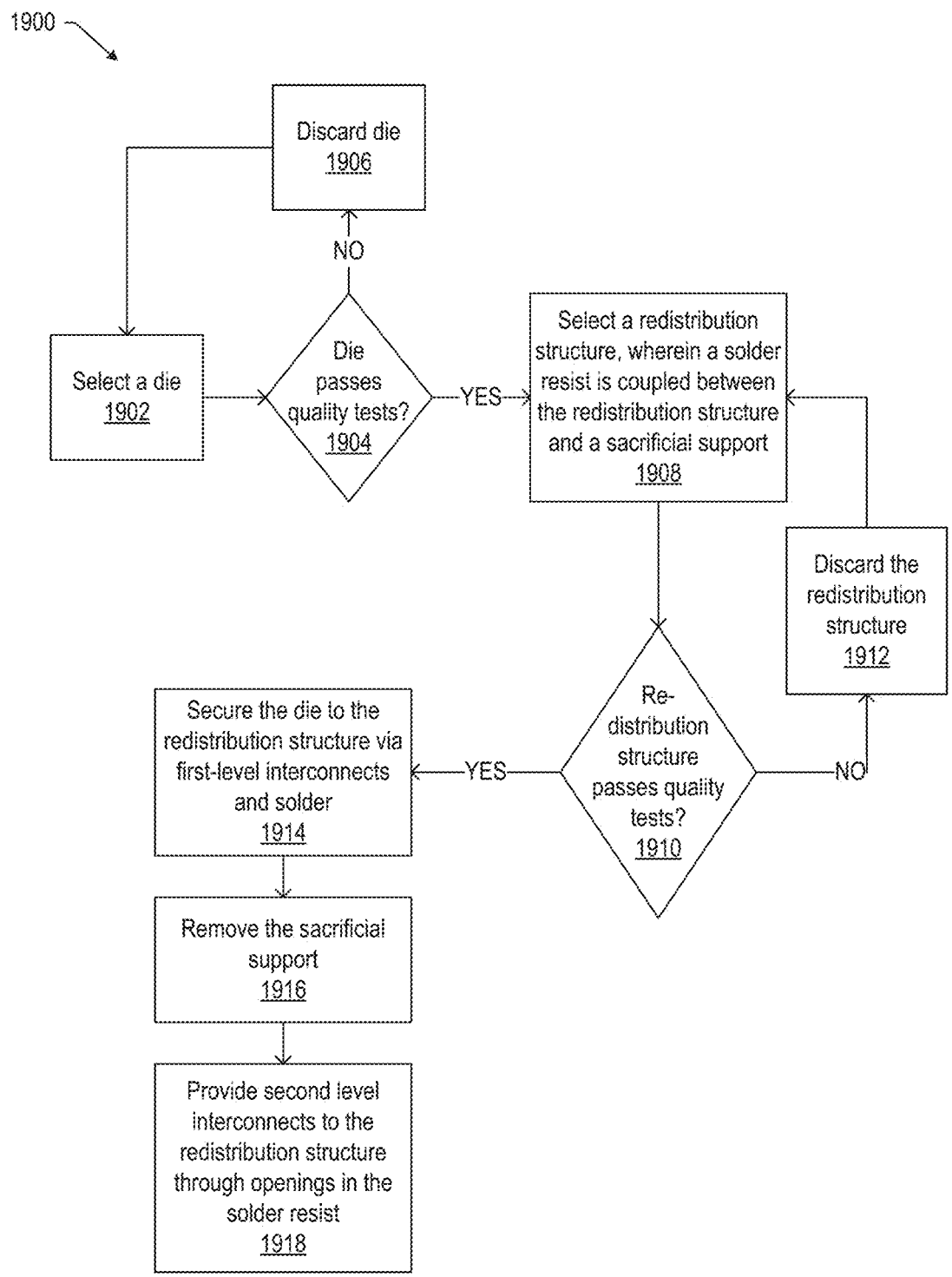
FIG. 19 is a flow diagram of a second method of manufacturing an IC package, in accordance with various embodiments.

FIG. 19 is a flow diagram of a second method 1900 of manufacturing an IC package, in accordance with various embodiments, utilizing the above advantages to reduce waste. While the operations of the method 1900 are arranged in a particular order in FIG. 19 and illustrated once each, in various embodiments, one or more of the operations may be repeated or performed in parallel (e.g., when multiple IC packages are manufactured simultaneously, multiple dies are tested simultaneously, redistribution structures are tested simultaneously with dies, etc.). Operations discussed below with reference to the method 1900 may be illustrated with reference to the IC package 100, but this is simply for ease of discussion, and the method 1900 may be used to manufacture any suitable IC package.

At 1902, a die may be selected (e.g., the die 102). The die may be selected at 1902 from a pool of available dies (e.g., after simulation from a wafer). The die of 1902 may take the form of any of the dies disclosed herein.

At 1904, the die of 1902 may be checked to determine whether it passes one or more quality tests. These quality tests may include any wafer sort tests, wafer probe tests, or singulated die-level tests, for example, and may involve parametric, functional tests at low and high temperatures to ascertain the quality of the die. These are simply illustrative examples, and the quality tests of 1904 may take any suitable form. If the die does not pass the quality tests at 1904, that die may be discarded at 1906, and another die may be selected at 1902.

If the die of 1902 does pass the quality tests at 1904, the method 1900 may proceed to 1908, at which a redistribution structure may be selected (e.g., the redistribution structure 104). The redistribution structure may be part of an assembly in which a solder resist is coupled between the redistribution structure and the sacrificial support (e.g., as discussed above with reference to FIG. 6). The redistribution structure may be selected at 1908 from a pool of such assemblies. The redistribution structure of 1908 may take the form of any of the redistribution structures disclosed herein.

At 1910, the redistribution structure of 1908 may be checked to determine whether it passes one or more quality tests. If the redistribution structure does not pass the quality tests at 1910, that redistribution structure may be discarded at 1912, and another redistribution structure may be selected at 1908.

If the redistribution structure of 1908 does pass the quality tests at 1910, the method 1900 may proceed to 1914, at which the die of 1902 may be secured to the redistribution structure of 1908 via first-level interconnects and solder (e.g., the first-level interconnects 106 and the solder 112). These operations may take the form of any of the embodiments disclosed herein (e.g., with reference to FIGS. 7 and 18).

At 1916, the sacrificial support may be removed. These operations may take the form of any of the embodiments disclosed herein (e.g., with reference to FIGS. 10 and 18).

At 1918, second-level interconnects may be provided to the redistribution structure through openings in the solder resist. These operations may take the form of any of the embodiments disclosed herein (e.g., with reference to FIGS. 12 and 18).

Figure 20:
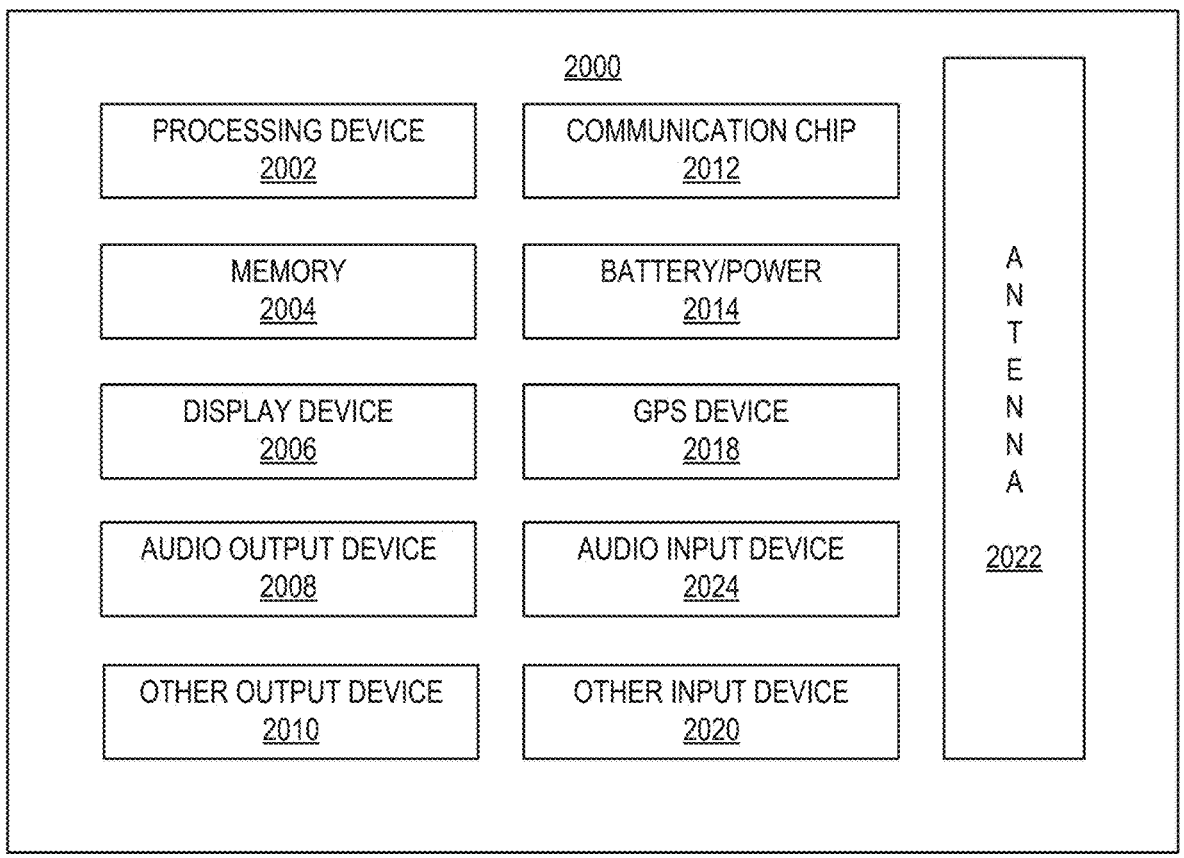
FIG. 20 is a block diagram of a computing device that may include one or more IC packages formed in accordance with the teachings of the present disclosure.

The embodiments disclosed herein may be included in any suitable device, such as any suitable computing device. For example, FIG. 20 is a block diagram of a computing device that may include any of the embodiments of the IC package 100, in accordance with the teachings of the present disclosure. A number of components are illustrated in FIG. 20 as included in the computing device 2000, but any one or more of these components may be omitted or duplicated, as suitable for the application. In some embodiments, some or all of these components are fabricated onto a single system-on-a-chip (SoC) die.

Additionally, in various embodiments, the computing device 2000 may not include one or more of the components illustrated in FIG. 20, but the computing device 2000 may include interface circuitry for coupling to the one or more components. For example, the computing device 2000 may not include a display device 2006, but may include display device interface circuitry (e.g., a connector and driver circuitry) to which a display device 2006 may be coupled. In another set of examples, the computing device 2000 may not include an audio input device 2024 or an audio output device 2008, but may include audio input or output device interface circuitry (e.g., connectors and supporting circuitry) to which an audio input device 2024 or audio output device 2008 may be coupled. Any one or more of the components of the computing device 2000 may include one or more IC packages 100.

The computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. In some embodiments, the processing device 2002 may include an IC package 100. The computing device 2000 may include a memory 2004, which may itself include one or more memory devices such as volatile memory (e.g., dynamic random access memory (DRAM)), non-volatile memory (e.g., read-only memory (ROM)), flash memory, solid state memory, and/or a hard drive. In some embodiments, the memory 2004 may include memory that shares a die with the processing device 2002. This memory may be used as cache memory and may include embedded DRAM (eDRAM) or spin transfer torque magnetic RAM (STT-M RAM).

In some embodiments, the computing device 2000 may include a communication chip 2012 (e.g., one or more communication chips). For example, the communication chip 2012 may be configured for managing wireless communications for the transfer of data to and from the computing device 2000. The term "wireless" and its derivatives may be used to describe circuits, devices, systems, methods, techniques, communication channels, etc., that may communicate data through the use of modulated electromagnetic radiation through a nonsolid medium. The term does not imply that the associated devices do not contain any wires, although in some embodiments they might not. The communication chip 2012 may include an IC package 100.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The computing device 2000 may include battery/power circuitry 2014. The battery/power circuitry 2014 may include one or more energy storage devices (e.g., batteries or capacitors) and/or circuitry for coupling components of the computing device 2000 to an energy source separate from the computing device 2000 (e.g., AC line power). The battery/power circuitry 2014 may include an IC package 100.

The computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example. The display device 2006 may include an IC package 100.

The computing device 2000 may include an audio output device 2008 (or corresponding interface circuitry, as discussed above). The audio output device 2008 may include any device that generates an audible indicator, such as speakers, headsets, or earbuds, for example. The audio output device may include an IC package 100.

The computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output). The audio input device 2024 may include an IC package 100.

The computing device 2000 may include a global positioning system (GPS) device 2018 (or corresponding interface circuitry, as discussed above). The GPS device 2018 may be in communication with a satellite-based system and may receive a location of the computing device 2000, as known in the art. The GPS device 2018 may include an IC package 100.

The computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device. The other output device 2010 may include an IC package 100.

The computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader. The other input device 2020 may include an IC package 100.

The computing device 2000 may have any desired form factor, such as a hand-held or mobile computing device (e.g., a cell phone, a smart phone, a mobile Internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2000 may be any other electronic device that processes data.

The following paragraphs provide various examples of the embodiments disclosed herein.

Example 1 is an integrated circuit (IC) package, including: a die; a redistribution structure, wherein the die is coupled to the redistribution structure via first-level interconnects and solder; a solder resist; and second-level interconnects coupled to the redistribution structure through openings in the solder resist.

Example 2 may include the subject matter of Example 1, and may further specify that the solder resist is a polymer material.

Example 3 may include the subject matter of Example 1, and may further specify that the solder resist is a film.

Example 4 may include the subject matter of Example 1, and may further specify that the solder resist is a laminate sheet.

Example 5 may include the subject matter of any of Examples 1-4 and may further specify that the solder resist is photoimageable.

Example 6 may include the subject matter of any of Examples 1-5, and may further include an underfill material disposed between the die and the redistribution structure.

Example 7 may include the subject matter of Example 6, and may further include a mold material disposed on the die such that the die is disposed between at least a part of the mold material and the underfill material.

Example 8 may include the subject matter of Example 7, and may further specify that the underfill material and the mold material are a same material.

Example 9 may include the subject matter of Example 8, and may further specify that the underfill material has a filler cut greater than or equal to 15 µm.

Example 10 may include the subject matter of Example 6, and may further specify that the underfill material has a filler cut greater than or equal to 15 µm.

Example 11 may include the subject matter of any of Examples 1-10, and may further specify that the first-level interconnects include copper pillars.

Example 12 may include the subject matter of any of Examples 1-11, and may further specify that the redistribution structure includes multiple redistribution layers, and the solder resist extends between at least two of the multiple redistribution layers.

Example 13 may include the subject matter of any of Examples 1-10 and 12, and may further specify that the second-level interconnects include solder balls.

Example 14 may include the subject matter of any of Examples 1-10 and 12, and may further specify that the second-level interconnects include solder paste contacts.

Example 15 is a computing device, including a substrate; and an integrated circuit (IC) package coupled to the substrate, wherein the IC package includes: a die, a redistribution structure, wherein the die is coupled to the redistribution structure via first-level interconnects and solder, a solder resist, and second-level interconnects coupled to the redistribution structure through openings in the solder resist.

Example 16 may include the subject matter of Example 15, and may further specify that the second-level interconnects are ball grid array (BGA) interconnects.

Example 17 may include the subject matter of Example 15, and may further specify that the second-level interconnects are land grid array (LGA) interconnects.

Example 18 may include the subject matter of any of Examples 15-17, and may further specify that the die includes a processing device.

Example 19 may include the subject matter of Example 18, and may further specify that the die further includes a memory device.

Example 20 may include the subject matter of any of Examples 15-19, and may further specify that the substrate is a printed circuit board (PCB).

Example 21 may include the subject matter of any of Examples 15-19, and may further specify that the substrate is an IC package.

Example 22 is a method of manufacturing a substrate-less package structure, including: providing a solder resist on a sacrificial support; forming a redistribution structure on the solder resist; securing a die to the redistribution structure via first-level interconnects and solder; after securing the die to the redistribution structure, removing the sacrificial support; and providing second-level interconnects to the redistribution structure through openings in the solder resist.

Example 23 may include the subject matter of Example 22, and may further include forming the openings in the solder resist.

Example 24 may include the subject matter of Example 23, and may further specify that the openings are formed in the solder resist after removing the sacrificial support.

Example 25 may include the subject matter of Example 23, and may further specify that forming the openings in the solder resist includes laser-structuring the solder resist.

Example 26 may include the subject matter of Example 23, and may further specify that forming the openings in the solder resist includes performing photolithography.

Example 27 may include the subject matter of Example 23, and may further specify that forming the openings in the solder resist includes etching.

Example 28 may include the subject matter of any of Examples 22-27, and may further specify that the sacrificial support includes a carrier and a releasable layer.

Example 29 may include the subject matter of any of Examples 22-27, and may further specify that forming the redistribution structure comprises electroplating at least part of the redistribution structure.

Example 30 may include the subject matter of any of Examples 22-27, and may further specify that forming the redistribution structure comprises electroless plating at least part of the redistribution structure.

Example 31 may include the subject matter of any of Examples 22-27, and may further specify that forming the redistribution structure comprises performing a subtractive process.

Example 32 may include the subject matter of any of Examples 22-31, and may further specify that the redistribution structure includes two redistribution layers and at least one via coupling the two redistribution layers.

Example 33 may include the subject matter of any of Examples 22-32, and may further specify that securing the die to the redistribution structure via first-level interconnects includes performing a mass reflow.

Example 34 may include the subject matter of any of Examples 22-33, and may further include before securing the die to the redistribution structure, providing a no-flow underfill material to the redistribution structure.

Example 35 may include the subject matter of any of Examples 22-33, and may further include after securing the die to the redistribution structure, providing an underfill material between the die and the redistribution structure.

Example 36 may include the subject matter of any of Examples 22-33, and may further include after securing the die to the redistribution structure, providing a same material as an underfill material and an overmold material.

Example 37 may include the subject matter of any of Examples 22-36, and may further include after providing second-level interconnects to the redistribution structure through the openings, separating multiple ones of the substrate-less package structures from each other.

Example 38 may include the subject matter of any of Examples 22-37, and may further specify that providing the solder resist on the sacrificial support comprises providing the solder resist, together with a releasable layer, on a carrier.

Example 39 is a method of manufacturing a substrate-less package structure, including: determining that a die passes a set of die quality tests; determining that a redistribution structure passes a set of redistribution structure quality tests, wherein a solder resist is coupled between the redistribution structure and a sacrificial support; and in response to determining that the die passes the set of die quality tests and the redistribution structure passes the set of redistribution structure quality tests: securing the die to the redistribution structure via first-level interconnects and solder, after securing the die to the redistribution structure, removing the sacrificial support, and providing second-level interconnects to the redistribution structure through openings in the solder resist.

Example 40 may include the subject matter of Example 39, and may further specify that the die is a first die, and the method further includes: determining that a second die does not pass the set of die quality tests; and discarding the second die without securing the second die to the redistribution structure.

Example 41 may include the subject matter of Example 39, and may further specify that the redistribution structure is a first redistribution structure, and the method further includes: determining that a second redistribution structure does not pass the set of redistribution structure quality tests; and discarding the second redistribution structure without securing the second redistribution structure to the die.

Example 42 may include the subject matter of any of Examples 39-41, and may further specify that the die has an area greater than or equal to 50 square millimeters.

Example 43 may include the subject matter of any of Examples 39-42, and may further include, in response to determining that the die passes the set of die quality tests and the redistribution structure passes the set of redistribution structure quality tests, forming openings in the solder resist.

The invention claimed is:

1. An integrated circuit (IC) package, comprising:
   a die;
   a redistribution structure, wherein the die is coupled to the redistribution structure via first-level interconnects;
   a solder resist layer; and
   second-level interconnects coupled to the redistribution structure through openings in the solder resist layer, wherein the second-level interconnects include solder at least partially in the openings in the solder resist layer, bottoms of the openings are provided by metal of the redistribution structure, and a surface of the solder resist layer is coplanar with the bottoms of the openings.

2. The IC package of claim 1, wherein the solder resist layer is photoimageable.

3. The IC package of claim 1, wherein the first-level interconnects include copper pillars.

4. The IC package of claim 1, wherein the redistribution structure includes multiple redistribution layers, and the multiple redistribution layers include solder resist.

5. The IC package of claim 1, wherein the second-level interconnects include solder balls.

6. The IC package of claim 1, wherein the second-level interconnects include solder paste contacts.

7. A computing assembly, comprising:
   a substrate; and
   an integrated circuit (IC) package coupled to the substrate, wherein the IC package includes:
     a die,
     a redistribution structure, wherein the die is coupled to the redistribution structure via first-level interconnects,
     a solder resist layer, and
     second-level interconnects coupled to the redistribution structure through openings in the solder resist, wherein the openings in the solder resist layer are tapered such that the openings are narrower closer to the die, bottoms of the openings are provided by metal in a redistribution layer of the redistribution structure, and an interface between the solder resist layer and the redistribution layer is coplanar with the bottoms of the openings.

8. The computing assembly of claim 7, wherein the die includes a processing device.

9. The computing assembly of claim 8, wherein the die further includes a memory device.

10. The computing assembly of claim 7, wherein the substrate is a printed circuit board (PCB).

11. The computing assembly of claim 7, wherein the substrate is an IC package.

12. The IC package of claim 1, wherein the first-level interconnects include solder.

13. The IC package of claim 1, wherein the first-level interconnects do not include solder.

14. The IC package of claim 1, wherein the solder resist includes a polymer.

15. The IC package of claim 1, further comprising:
    an underfill material between the die and the redistribution structure.

16. The IC package of claim 15, further comprising:
    a mold material on the die such that the die is between at least a part of the mold material and the underfill material.

17. The IC package of claim 16, wherein the underfill material and the mold material are a same material.

18. The IC package of claim 17, wherein the underfill material has a filler cut greater than or equal to 15 μm.

19. The IC package of claim 15, wherein the underfill material has a filler cut greater than or equal to 15 μm.

20. The computing assembly of claim 7, wherein the second-level interconnects are ball grid array (BGA) interconnects.

21. The computing assembly of claim 7, wherein the second-level interconnects are land grid array (LGA) interconnects.

22. The computing assembly of claim 7, wherein the first-level interconnects do not include solder.

23. The computing assembly of claim 7, wherein the second-level interconnects include solder at least partially in the openings in the solder resist.

24. The IC package of claim 1, wherein a thickness of the solder resist layer is greater than a thickness of a redistribution layer at bottoms of the openings.

25. The computing assembly of claim 7, wherein a thickness of the solder resist layer is greater than a thickness of the redistribution layer.

* * * * *

UNITED STATES PATENT AND TRADEMARK OFFICE
CERTIFICATE OF CORRECTION

Page 1 of 1

PATENT NO. : 10,903,166 B2
APPLICATION NO. : 16/060918
DATED : January 26, 2021
INVENTOR(S) : Sanka Ganesan et al.

It is certified that error appears in the above-identified patent and that said Letters Patent is hereby corrected as shown below:

On the Title Page

In item (71), Applicants:, delete "Sanka Ganesan, Chandler, AZ (US; Thorsten Meyer, Regensburg (DE); Gerald Ofner, Regensburg (DE)".

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*